United States Patent [19]
Partovi et al.

[11] Patent Number: 4,972,101
[45] Date of Patent: Nov. 20, 1990

[54] NOISE REDUCTION IN CMOS DRIVER USING CAPACITOR DISCHARGE TO GENERATE A CONTROL VOLTAGE

[75] Inventors: Hamid Partovi, Westboro; John Ngai, Littleton, both of Mass.

[73] Assignee: Digital Equipment Corporation, Maynard, Mass.

[21] Appl. No.: 409,118

[22] Filed: Sep. 19, 1989

[51] Int. Cl.⁵ .......................................... H03K 17/16
[52] U.S. Cl. .................................. 307/443; 307/246; 307/263; 307/362; 307/469
[58] Field of Search ............... 307/443, 448, 451, 465, 307/469, 481, 362, 246, 263, 270

[56] References Cited

U.S. PATENT DOCUMENTS

| | | | |
|---|---|---|---|
| 4,567,378 | 1/1986 | Raver | 307/443 X |
| 4,614,882 | 9/1986 | Parker et al. | 307/443 |
| 4,622,482 | 11/1986 | Ganger | 307/263 X |
| 4,661,928 | 4/1987 | Yasuoka | 307/443 X |
| 4,724,340 | 2/1988 | Sood | 307/443 |
| 4,731,553 | 3/1988 | Van Lehn et al. | 307/443 |
| 4,758,743 | 7/1988 | Dehganpour et al. | 307/443 |
| 4,785,203 | 11/1988 | Nakamura | 307/443 X |
| 4,789,796 | 12/1988 | Foss | 307/443 |
| 4,797,579 | 1/1989 | Lewis | 307/246 X |
| 4,857,770 | 8/1989 | Partovi et al. | 307/443 X |
| 4,857,863 | 8/1989 | Ganger et al. | 307/263 X |
| 4,894,561 | 1/1990 | Nogami | 307/263 X |
| 4,906,867 | 3/1990 | Petty | 307/246 X |
| 4,908,526 | 3/1990 | Mefford | 307/263 |

Primary Examiner—David Hudspeth
Attorney, Agent, or Firm—Arnold, White & Durkee

[57] ABSTRACT

A pull-up or pull-down transistor in an output buffer or the like is controlled to limit dI/dt and thus reduce noise. This control employs a series transistor in the driver circuit which has a modulating voltage applied to its gate. This modulating voltage is generated in a circuit which uses precision-timed clocks as a reference so that variations in electrical parameters (process, temperature and power supply dependent) will not cause variation in circuit noise. A dummy driver circuit is used to discharge a capacitor at a rate dependent upon the modulating voltage, and the capacitor voltage is compared with a reference at a time determined by the precision clock. The result of the comparison is used to increment or decrement the modulating voltage.

20 Claims, 2 Drawing Sheets

NOISE REDUCTION IN CMOS DRIVER USING CAPACITOR DISCHARGE TO GENERATE A CONTROL VOLTAGE

BACKGROUND OF THE INVENTION

This invention relates to integrated circuit devices, and more particularly to reducing the noise in integrated circuit devices by limiting the magnitude of dI/dt variations (where dI/dt is the time gradient of current), taking into account variations in electrical parameters.

In a complex integrated circuit device such as a microprocessor chip or the like, noise generated within the device itself can become the source of false data or reduction in performance; that is, changes in current in an inductive environment result in voltage changes, as $V = L(dI/dt)$. For example, a large number of output buffers may be simultaneously activated upon a certain system clock going high to drive external buses, and they produce a very large current surge in the power supply leads, Vdd and Vss. The rapidly-changing nature of this current surge, i.e., large time gradient of current, results in a variation in the supply voltage to the remainder of the chip due to inductance in the bond wires, pins and leads, and this variation can result in false data at sensitive nodes within the chip. To reduce this effect, it has been the practice to provide multiple power supply leads for the Vdd and Vss inputs, and to route these Vdd and Vss supplies around to various points on the chip using a number of parallel paths. This duplication of pins, bonding pads and metallization for routing of conductors utilizes excess space on the chip and increases the package cost. Another way of reducing the effect of inductive switching noise is to provide an on-chip decoupling capacitor, but this capacitance has to have a value of perhaps 10-to-100 nfd, which consumes a large amount of chip area and reduces manufacturing yield. Of course, the speed of operation of large drivers can be reduced to limit dI/dt, but this reduction would impact all process, temperature and supply variations, so the performance of the device is unduly compromised.

In U.S. Pat. No. 4,614,882, issued to Parker & May and assigned to Digital Equipment Corporation, a bus driver is disclosed which modulates the conductance of a driver transistor as a function of device parameter variations in order to optimize peak dI/dt. This circuit utilized discrete or "external" (off-chip) precision resistors, however, and so cost and space utilization were compromised.

SUMMARY OF THE INVENTION

In accordance with one embodiment of the invention, a pull-up or pull-down transistor in an output buffer or the like on an integrated circuit chip is controlled to limit dI/dt and thus reduce inductive switching noise in the power supply leads for the chip. This control employs a series transistor in the driver circuit for the ouptput buffer, with a modulating voltage applied to the gate of the series transistor to adjust its conductance. This modulating voltage is generated in a circuit which uses precision-timed clocks as a reference so that variations in electrical parameters (which are process, temperature and power supply dependent) will not cause variation in circuit noise. A dummy driver circuit is used to discharge a capacitor at a rate dependent upon the modulating voltage, and the capacitor voltage is compared with a reference at a time determined by the precision clock. The result of the comparison is used to increment or decrement the modulating voltage.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

DETAILED DESCRIPTION OF SPECIFIC EMBODIMENT

Figure 1:
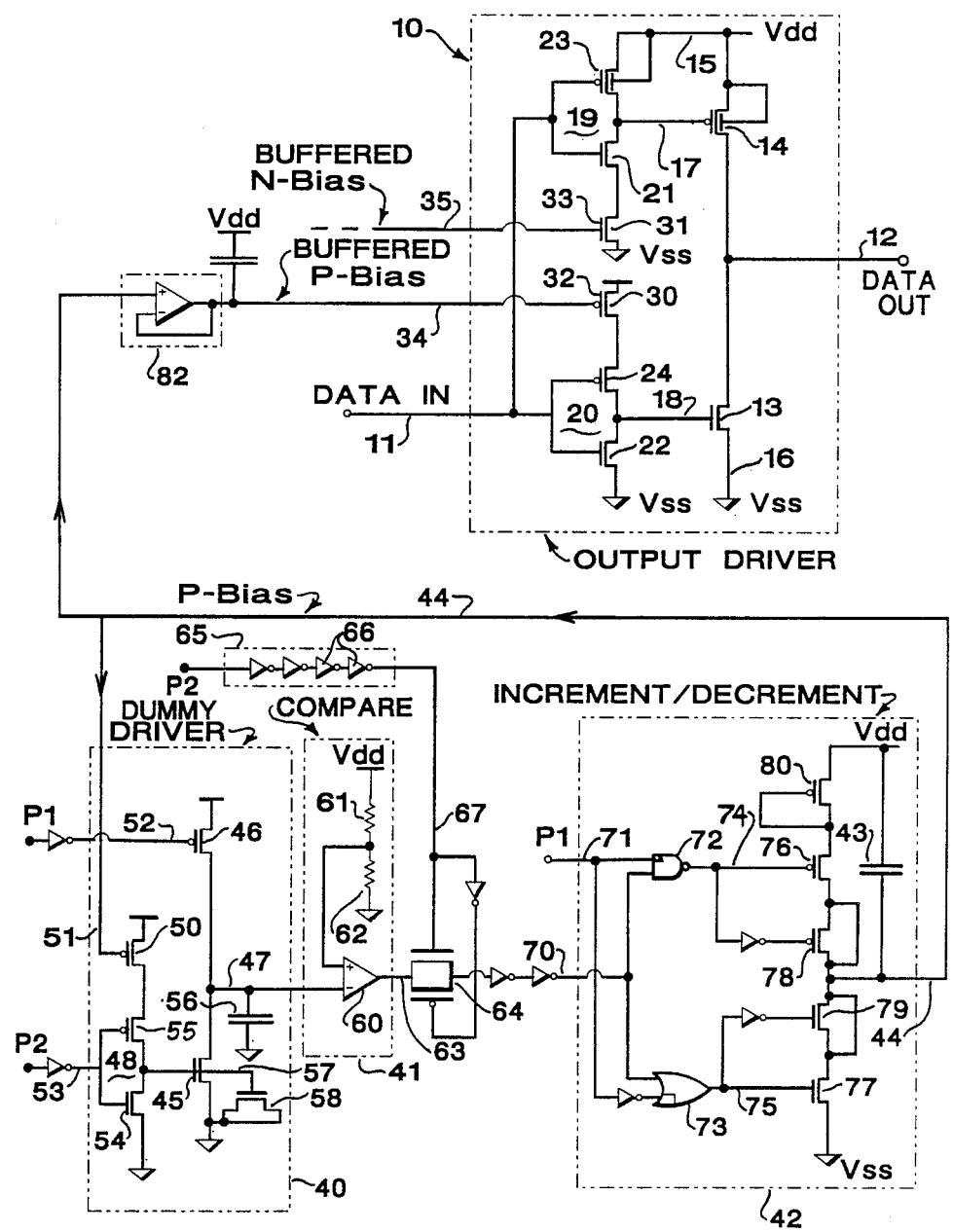
FIG. 1 is an electrical diagram in schematic form of an output buffer circuit employing dI/dt control according to one embodiment of the invention.
Figure 2:
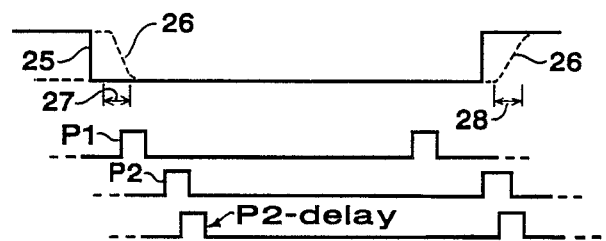
FIG. 2 is a timing diagram showing voltage vs. time for some of the events occuring in the circuit of FIG. 1.

Referring to FIG. 1, an example of a circuit which makes use of the features of the invention is illustrated. A CMOS output buffer circuit 10 has a data input 11 and a data output 12, and employs an N-channel pull-down transistor 13 and a P-channel pull-up transistor 14. The source-drain paths of the transistors 13 and 14 are connected in series between a positive voltage supply 15 and a ground or Vss supply 16. The gates 17 and 18 of the pull-up and pull-down transistors 14 and 13 are driven from a pair of inverters 19 and 20, each of which includes an N-channel transistor 21 or 22 and a P-channel transistor 23 or 24. When the input voltage on the input node 11 goes high, the N-channel transistors 21 and 22 tend to turn on, pulling the gates 17 and 18 low, whereas when the input node 11 goes low, to about Vss, the N-channel transistors 21 and 22 tend to turn off and the P-channel transistors 23 and 24 tend to turn on, thus pulling up the gates 17 and 18. Referring to FIG. 2, when the input node 11 goes low as indicated by the waveform 25 and gates 17 and 18 go toward Vdd as indicated by the waveform 26, the N-channel pull-down transistor 13 turns on the P-channel pull-up transistor 14 turns off; similarly, when the input node 11 goes high the gates 17 and 18 go low and the N-channel pull-down transistor 13 turns off and the P-channel pull-up transistor 14 turns on. The time period 27 or 28 needed to make these transitions in the data output voltage is dependent upon the impedances in series with the charge path for the gate 18 and the discharge path for the gate 17, as well as the capacitance of these nodes. Of course, the output node 12 is usually capacitively loaded so the transition time of the output voltage is also dependent upon this loading and the transition rate of gates 17 and 18.

According to the invention, in the circuit of FIG. 1 a P-channel control transistor 30 is placed in series with the P-channel load transistor 24 of the inverter 20, and likewise an N-channel control transistor 31 is placed in series with the N-channel pull-down transistor 21 of the inverter 19. Separate control voltages P-Bias and N-Bias are applied to the gates 32 and 33 of these two transistors 30 and 31 by lines 34 and 35, and these control voltages P-Bias and N-Bias are modulated to maintain a desired minimum transition time 27 or 28, as will be explained.

A semiconductor chip employing a circuit as illustrated would ordinarily have a large number of the output buffer circuits 10. For example, a microprocessor device may have thirty-two data bus outputs 12 along with many internal bus drivers and clock drivers; each of these nodes would have a circuit 10, but all of these circuits 10 would share the same control voltage lines 34 and 35, and so there need be only one set of control voltage generator circuits on the chip.

In FIG. 1, a control voltage generator circuit for producing the P-Bias modulating voltage applied to the line 34 is illustrated according to one embodiment. This generator circuit includes a dummy driver 40, a comparator 41 and an increment/decrement circuit 42 to establish a voltage across a capacitor 43 to produce this P-Bias output on line 44.

The dummy driver 40 of FIG. 1 has an N-channel pull-down transistor 45 and a P-channel pull-up transistor 46; the transistor 45 corresponds to the transistor 13 of the output buffer 10. These transistors 45 and 46 are connected in series between a Vdd supply and Vss, and the node joining the source-drain paths of the transistors is an output node 47. Also, the dummy driver has an inverter 48 corresponding to the inverter 20 and this inverter 48 has a control transistor 50 corresponding to the control transistor 30 in the inverter 20, with the gate 51 of the control transistor receiving the same P-Bias control voltage from the line 44 as is applied to the gate 32 (through a unity-grain buffer). Two non-overlapping clock voltages P1 and P2 as illustrated in FIG. 2 are employed in the generator circuit, with the clock P1 being applied through an inverter to the gate 52 of the P-channel pull-up transistor 46 and the clock P2 being applied through an inverter to the input node 53 of the dummy driver. This input node 53 is connected to the gates of N-channel and P-channel transistors 54 and 55 corresponding to the transistors 22 and 24 of the inverter 20. When the clock P1 goes high, the gate 52 goes low to turn on the P-channel transistor 46 and charge a capacitor 56 which is connected across the output node 47, then the transistor 46 turns off. The clock P2 goes high to pull the input node 53 low and thus the node 57 goes high to turn on the N-channel transistor 45 and begin to discharge the capacitor 56. The rise time of the voltage on the node 57 at the gate of the transistor 45 is dependent upon the impedance presented by the transistor 50 which is of course controlled by the P-Bias voltage on the line 44 used to modulate the corresponding transistor 30 (through the unity-gain buffer). Thus, as the voltage on line 44 increases, the P-channel transistor 50 is held in a lower-conductance state and the node 57 and its capacitor 58 charge slower, impeding the discharge path of the capacitor 56 and leaving the output node 47 at a higher level in a given time period. Simiarly, a lower value of the P-Bias voltage on line 44 increases the conductivity of the transistor 50 so node 57 charges at a higher rate, and thus the capacitor discharges more in a given time period.

The comparator 41 employs an amplifier 60 to compare the output node 47 of the dummy driver 40 to a reference voltage of two-thirds Vdd produced by a voltage divider made up of a pair of resistors 61 and 62 connected across Vdd and Vss. When the voltage on the node 47 is more positive than ⅔ Vdd, the amplifier 60 produces a low voltage on an output node 63, or if less than ⅔ Vdd the output node will be high. This output 63 is sampled at a fixed delay after P2 by a pass gate 64. The clock P2 is applied to the input of a delay circuit 65 which may consist of, for example, four inverter stages 66, and the output 67 of this delay circuit (inverted for P-channel) is applied to the gates of N- and P-channel transistors of the pass gate 64. The clock P2-delay on this output 67, as seen in FIG. 2, should not overlap the next P1 clock. The delay through the delay circuit 65 should be longer than the delay through the comparator circuit 41. The value chosen for repetition rate of the clocks P1 and P2 is not critical, but should remain constant. Note that it is the pulse width of P2 which determines the amount of discharge of the capacitor 56 in a cycle, so this pulse width is what should remain constant. Similarly P1 should be of constant pulse width so the amount of increment or decrement is constant; this is not as stringent a requirement as for P2, i.e., P1 should be sufficiently long so that the increment/decrement value is a relatively constant value of 50-millivolts, in this example.

The increment/decrement circuit 42 of FIG. 1 receives as its input 70 the output of the comparator 41 through the pass gate 64, amplified (brought to a rail-to-rail level) by a pair of inverters. The increment/decrement decision is made in response to the clock P1 which is applied to an input 71. A NAND gate 72 is responsive to the inputs 70 and 71, and NOR gate 73 is responsive to the input 70 and the inverted clock P1 from input 71. The outputs 74 and 75 of these gates 72 and 73 are used to increment or decrement the voltage across the capacitor 43 by a series circuit consisting of a P-channel pull-up transistor 76, an N-channel pull-down transistor 77, P- and N-channel transistors 78 and 79 connected to function as capacitors, and a P-channel transistor 80 connected to function as a diode. The diode-connected device 80 is a long-channel device so its threshold voltage is increased; this device functions to prevent the P-Bias voltage on line 44 from increasing above a value of Vdd-Vtp (where Vtp is a P-channel threshold voltage), so this device prevents the output drivers 30 from being shut off. The transistors 76 and 77 are long-channel devices, sized in conjunction with the capacitor 43 to provide a rather small increment/decrement step of about 50 millivolts. The transistors 78 and 79 connected as capacitors are sized to cancel charge-injection effects that occur when the transistors 76 or 77 are turned off; this is important since the node 44 is a high-impedance dynamic node.

The output node 44 is connected through a buffer 82 to the control input 34. The buffer 82 exhibits unity gain and functions to isolate the node 44 from all of the nodes 34, since node 44 is a high impedance dynamic node, and this buffer 82 also functions as a low-pass filter, i.e., has a low bandwidth, to prevent the incremental modulations of the P-Bias signal on line 44 from being transmitted to the input 34. The buffer is shown as an amplifier with output connected to its negative input, but any such low-bandwidth unity gain buffer can be used so long as it has a large output voltage range; the output voltage range at control input 34 should be Vss to Vdd-Vtp.

In operation, when P1 goes active (high) the dummy driver 40 is reset; the node 47 is precharged to Vdd. Note 57 is discharged to Vss (at the end of P2). Then when P2 goes active (high) the node 47 (capacitor 56) discharges through the N-channel transistor 45, and how far this discharge goes is dependent upon the value of the P-Bias voltage on line 44, so the comparator output 63 will be high if the node 47 is less than the reference voltage or low if the node 47 is greater then the reference voltage defined by the resistors 61, 62. When P2-delay goes high, the output 63 from the comparator 41 is passed to the input 70 of the increment/decrement circuit 42, then when P1 goes active again the charge on the capacitor 43 is incremented or decremented depending upon the value of the output 63.

The value of the P-Bias voltage on node 44 is fed back via transistor 50 to modulate the rising edge rate at the gate of the transistor 45, which in turn controls the rate at which the node 47 is discharged during P2. If at the end of P2 the node 47 is discharged below the reference voltage ($\frac{2}{3}$ Vdd), the voltage on output 63 will go high; during the next phase P1, the voltage P-Bias across the capacitor 43 will be incremented slightly (approximately 50-millivolt), which in turn will slow the discharge of the node 47 during the next phase P2. On the other hand, if at the end of phase P2 the node 47 is still above the reference voltage ($\frac{2}{3}$ Vdd), the output 63 from the comparator will go low; during the next phase P1 the voltage across the capacitor 43 will be decremented, which will speed up the discharge of the node 47 during the next phase P2. This increment/decrement operation is repeated until the P-Bias voltage at node 44 is at a level required for the transistor 45 to discharge the capacitor 56 to the reference level during a single phase P2. The P-Bias voltage will then oscillate above and below this level, incrementing and decrementing on P1 pulses, to maintain an average value of the proper level; this insures a fixed slew rate of the dummy pull-down 45 (and thus of the output pull-down 13), i.e., dV/dt remains relatively constant over variations in parameters. Note the relationships:

$$dI/dt \alpha dV/dt$$

$$dV/dt \approx (\Delta V\Phi/\Delta t)$$

$$(\Delta V\Phi/\Delta t) \alpha f\, Vdd$$

where f is the repetition rate of P1 and P2 (there is one increment or decrement per P1 cycle); thus so as long as f remains constant the dI/dt factor remains a constant fraction of Vdd, i.e., fixed by f and Vdd.

The N-Bias signal on the line 33 is generated in a circuit which corresponds to (is complementary to) the dummy driver 40, comparator 41 and increment/decrement circuit 42 used to generate the P-Bias signal, but modified to produce a mirror-image signal for driving a N-channel transistor instead of a P-channel transistor.

Figure 3:
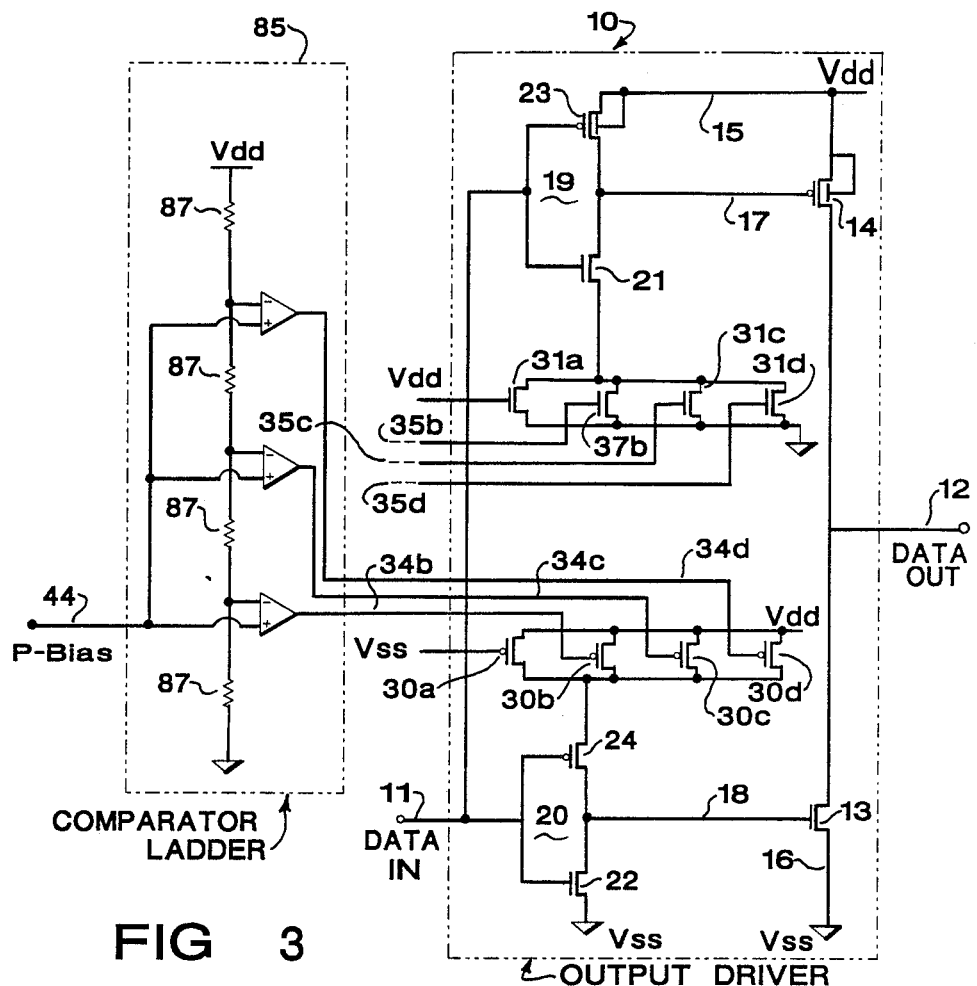
FIG. 3 is an electrical diagram in schematic form of a part of the circuit of FIG. 1 according to another embodiment of the invention.

Referring to FIG. 3, the P-Bias (and N-Bias) signals may be distributed to the various buffers 10 on the integrated circuit chip in a digital rather than an analog form. In this manner, the effects of variations in the magnitude of the P-Bias or modulating signal on line 34 (or line 35) due to variations in the distance from the buffer 82 (i.e., IR drop and transient supply noise) are avoided. The output buffer 10 employs a set of P-channel transistors 30a, 30b, 30c and 30d to modulate the transition time in the circuit of FIG. 3, in place of the single transistor 30 of FIG. 1. Likewise, a set of N-channel transistors 31a–31d are employed. One or more of the transistors 30a–30d is switched on, depending upon the magnitude of the P-Bias voltage on line 44. A comparator ladder 85 composed of amplifiers 86 and a resistor ladder 87 produces a number of outputs 34b, 34c, and 34d according to the voltage level on the line 44. Although a three-level arrangement is illustrated, it is understood that a larger number of signal levels and a larger number of the transistors 30a–30d could be used for finer resolution. The binary output 34b–34d of the comparator ladder 85 may be encoded (useful when a larger number of levels is being resolved) and transmitted to the location on the chip adjacent to the output buffers where it will be used, and decoded at this location; this would reduce the number of metallization lines needed to transfer the encoded binary information, and thus reduce the area demands.

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A drive circuit for a controlled device in an integrated circuit, comprising:
   (a) a pre-drive circuit applying a binary data signal to an input of said controlled device at a transition rate dependent upon a modulating signal;
   (b) a circuit for generating said modulating signal with a magnitude responsive to a capacitor discharge during a fixed time determined by a clock input.

2. A circuit according to claim 1 wherein said controlled device is an MOS driver transistor.

3. A circuit according to claim 1 wherein said pre-drive circuit is an inverter having said modulating signal applied to a series transistor in said inverter.

4. A circuit according to claim 3 wherein said modulating signal is a voltage which is incremented or decremented according to said capacitor discharge compared to a reference voltage.

5. A circuit according to claim 4 wherein said modulating signal is employed to control the rate of said capacitor discharge.

6. A method of driving a controlled device in an integrated circuit, comprising the steps of:
   (a) charging a capacitor at a first time period;
   (b) discharging said capacitor beginning at a second time after said first time period, at a rate dependent upon a control voltage;
   (c) comparing the voltage on said capacitor with a reference voltage at a third time after said second time, to produce a compare voltage;
   (d) in response to said compare voltage, incrementing or decrementing said control voltage; and
   (e) modulating a drive voltage applied to said controlled device in response to said control voltage.

7. A method according to claim 6 wherein the peak dI/dt in said controlled device is limited by modulating the rise or fall time of said drive voltage.

8. A method of operating a driver circuit in an integrated circuit device, the driver device having an energized state and a non-energized state, comprising the steps of:
   (a) applying a state-changing signal to an input of said driver device, said state-changing signal being responsive to a modulating signal to adjust the rate of switching said driver device between said non-energized state and said energized stage; and (b) varying said modulating signal in response to the amount of discharge of a precharged node during a fixed time defined by clock voltages.

9. A method according to claim 8 wherein said driver device is an MOS transistor, and said input is a gate electrode.

10. A method according to claim 8 including the steps of comparing the voltage on said precharged node to a reference voltage, and incrementing or decrementing said modulating signal in response to said step of comparing.

11. A method according to claim 10 including the step of starting said discharge of said precharged node in response to a clock voltage, and activating said step of comparing in response to a subsequent clock voltage.

12. A driver circuit in an integrated circuit device, comprising:
 (a) a driver device having an energized state and a non-energized state, and having an input for receiving a state-changing signal;
 (b) pre-driver means connected to said input for applying said state-changing signal to said driver device, said pre-driver means being responsive to a modulating signal to adjust the rate of switching said driver device from said non-energized state to said energized state;
 (c) modulating signal generating means having an output connected to said pre-driver means, said generating means producing said modulating signal of a magnitude varied in response to the amount of discharge of a precharged node during a fixed time; and
 (d) clock means applying clock voltages to define said fixed time to said generating means.

13. A circuit according to claim 12 wherein said driver device is an MOS transistor, and said input is a gate electrode.

14. A circuit according to claim 12 wherein said pre-driver means is an inverter circuit having a series MOS transistor, and said modulating signal is applied to a gate of said MOS transistor.

15. A circuit according to claim 12 wherein said generating means includes means for comparing the voltage on said precharged node to a reference voltage, and means for incrementing said modulating signal in response to said means for comparing.

16. A circuit according to claim 15 wherein said clock means applies a clock voltage and a delayed clock voltage to said generating means, said delayed clock voltage occuring said fixed time after said clock voltage; said clock voltage starting said discharge of said precharged node, said delayed clock voltage activating said means for comparing.

17. A circuit according to claim 16 wherein state-changing signal is a voltage making a transition between a first level and a second level.

18. A circuit according to claim 12 wherein said modulating signal is an analog signal and said pre-driver means includes a transistor responsive to said analog signal.

19. A circuit according to claim 12 wherein said modulating signal is a digital signal conveyed by a plurality of conductors, and said pre-driver means includes a plurality of transistors responsive to said digital via said plurality of conductors.

20. A circuit according to claim 12 wherein said state-changing signal is a voltage making a transition between a first level and a second level.

* * * * *